(12) United States Patent
Schroeder

(10) Patent No.: US 7,259,107 B2
(45) Date of Patent: Aug. 21, 2007

(54) METHOD OF FORMING ISOLATED FEATURES OF SEMICONDUCTOR DEVICES

(75) Inventor: Uwe Paul Schroeder, Lake Carmel, NY (US)

(73) Assignee: Infineon Technologies AG, Munich (DE)

( * ) Notice: Subject to any disclaimer, the term of this patent is extended or adjusted under 35 U.S.C. 154(b) by 155 days.

(21) Appl. No.: 11/062,722

(22) Filed: Feb. 22, 2005

(65) Prior Publication Data
US 2006/0189122 A1 Aug. 24, 2006

(51) Int. Cl.
*H01L 21/44* (2006.01)
*H01L 21/302* (2006.01)

(52) U.S. Cl. ............... 438/763; 438/689; 257/E21.023

(58) Field of Classification Search ........... 438/950, 438/952, 942, 671, 553, 551
See application file for complete search history.

(56) References Cited

U.S. PATENT DOCUMENTS

| 6,518,151 B1* | 2/2003 | Dobuzinsky et al. | 438/551 |
| 2003/0032269 A1* | 2/2003 | Dobuzinsky et al. | 438/551 |
| 2004/0209486 A1* | 10/2004 | Naeem et al. | 438/786 |
| 2005/0130410 A1* | 6/2005 | Oweyang et al. | 438/637 |

* cited by examiner

*Primary Examiner*—Scott B. Geyer
*Assistant Examiner*—Elias Ullah
(74) *Attorney, Agent, or Firm*—Slater & Matsil, L.L.P.

(57) ABSTRACT

A method of forming isolated features of semiconductor devices is disclosed. A first hard mask is deposited over a material layer to be patterned, and a second hard mask is deposited over the first hard mask. The second hard mask is patterned with a pattern for an array of features using an off-axis lithography method. A portion of the pattern for the array of features is transferred to the first hard mask. The first hard mask is then used as a mask to pattern the material layer.

20 Claims, 7 Drawing Sheets

METHOD OF FORMING ISOLATED FEATURES OF SEMICONDUCTOR DEVICES

TECHNICAL FIELD

The present invention relates generally to the fabrication of semiconductor devices, and more particularly to the formation of isolated features of integrated circuits.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

There is a trend in the semiconductor industry towards scaling down the size of integrated circuits, to meet demands of increased performance and smaller size. However, as semiconductor devices become smaller, it becomes more difficult to pattern material layers because of diffraction and other effects that occur during the lithography process.

Thus, what are needed in the art are improved methods of patterning features of semiconductor devices.

SUMMARY OF THE INVENTION

These and other problems are generally solved or circumvented, and technical advantages are generally achieved, by preferred embodiments of the present invention, which provide novel methods of patterning isolated small features or groups of small features of a semiconductor device.

In accordance with a preferred embodiment of the present invention, a method of patterning a material layer of a semiconductor device includes providing a workpiece, a material layer being disposed over the workpiece, depositing a first layer of masking material over the material layer, and forming a second layer of masking material over the first layer of masking material, the second layer of masking material comprising a first pattern. A third layer of masking material is formed over the second layer of masking material, the third layer of masking material comprising a second pattern, at least a portion of the second pattern being larger than the first pattern. The third layer of masking material and the second layer of masking material are used as a mask to pattern the first layer of masking material. At least the first layer of masking material is used as a mask to pattern the material layer.

In accordance with another preferred embodiment of the present invention, a method of patterning a material layer of a semiconductor device includes providing a workpiece, forming a material layer over the workpiece, depositing a first hard mask over the material layer, and depositing a second hard mask over the first hard mask, wherein the first hard mask comprises a material that is etchable selective to the second hard mask. An anti-reflective coating is deposited over the second hard mask, a first layer of resist is deposited over the anti-reflective coating, and the first layer of resist is patterned with a first pattern using an off-axis lithography method. The first layer of resist is used as a mask to remove exposed portions of the anti-reflective coating and the second hard mask, patterning the second hard mask and leaving portions of the first hard mask exposed. The first layer of resist and the anti-reflective coating are removed, and a second layer of resist is deposited over the patterned second hard mask and exposed portions of the first hard mask. The method includes patterning the second layer of resist with a second pattern using an on-axis lithography method, the second pattern being different from the first pattern, using the second layer of resist and the patterned second hard mask as a mask to remove exposed portions of the first hard mask, and removing at least the second layer of resist. The first hard mask is used as a mask to remove portions of the material layer, patterning the material layer.

In accordance with yet another preferred embodiment of the present invention, a method of patterning a material layer of a semiconductor device includes providing a workpiece, forming a material layer over the workpiece, depositing a first hard mask over the material layer, and depositing a second hard mask over the first hard mask, the second hard mask comprising a different material than the first hard mask. The second hard mask is patterned with a first pattern for an array of features using an off-axis lithography method, and a portion of the first pattern for the array of features is transferred to the first hard mask. The first hard mask is used as a mask to pattern the material layer.

Advantages of preferred embodiments of the present invention include providing an improved method of accurately patterning dense isolated regions of small features. Ultra-dense features having a small pitch and sharp resolution that are isolated or formed in isolated groups may be manufactured using the method described herein.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a method of patterning isolated contact holes of semiconductor devices. The invention may also be applied, however, to the patterning of other relatively isolated features or groups of features of semiconductor devices, such as patterns for features comprising a minimum feature size of the device, resistor islands, or relatively short conductive lines, as examples.

Figure 1:
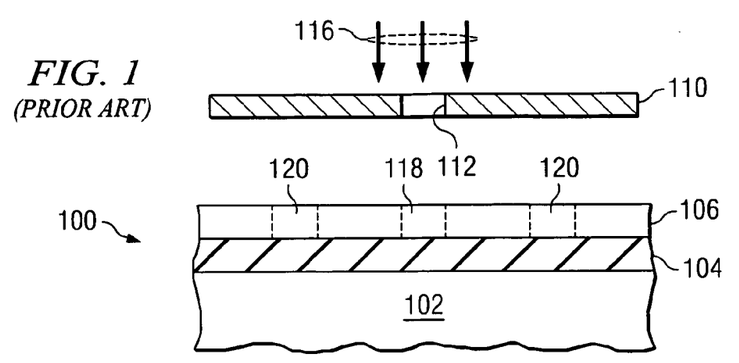
FIG. 1 illustrates a prior art on-axis illumination method of lithography.

Prior art lithography techniques will first be discussed, with reference to FIGS. 1 through 7. With reference to FIG. 1, there is shown a prior art conventional on-axis projection illumination method of lithography of a semiconductor device 100 in a cross-sectional view. The semiconductor device 100 includes a workpiece 102. The workpiece 102 has a material layer 104 disposed thereon that is to be patterned. A layer of resist 106 is deposited over the material layer 104. The layer of resist 106 is patterned using a mask 110. The layer of resist 106 is illuminated by a light source (not shown). The light source in the majority of prior art lithography systems comprises an on-axis light source, for example, that emits light 116 in the shape of a circular light beam in the pupil plane. Light 116 from the light source passes through the mask 110, and the patterns 112 in the mask 110 are transferred to the layer resist 106, e.g., at 118. The layer of resist 106 is then developed, and the patterned resist layer 106 is then used as a mask while the material layer 104 is patterned, e.g., etched, to transfer the pattern of the resist 106 to the material layer 104.

A problem that can occur in semiconductor lithography, especially in the patterning of small isolated features such as pattern 118, is that diffraction effects of the light passing through the mask 110 cause diffraction orders to illuminate the layer of resist 106 in undesired locations, e.g., at 120. The diffraction effects are also known as Bragg diffraction. Serifs and phase shifting materials (not shown) are often used in lithography masks 110 in an attempt to reduce the diffraction effects of on-axis light sources, for example.

Figure 2:
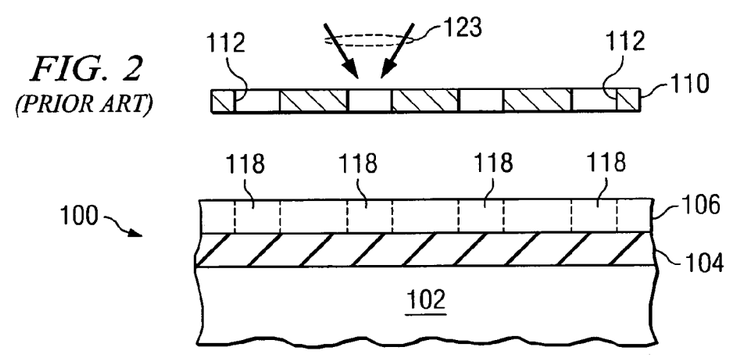
FIG. 2 illustrates a prior art off-axis illumination method of lithography.

FIG. 2 illustrates a prior art off-axis illumination method of lithography in a cross-sectional view. In this method, an off-axis light source is used, e.g., wherein the light source comprises one or more beams of light 123 disposed about but not directly disposed on the axis of the direction of exposure. The beam or beams of light 123 emitted by an off-axis light source is missing an inner part; e.g., the light 123 may be ring-shaped or split up in several point-like patterns in the pupil plane. Examples of off-axis light sources include dual beam light sources (e.g., di-pole), annular light sources that emit light 123 in a ring or annular-shape, and quadrupole light sources that emit four light beams 123, as examples. Off-axis light sources may be used where a pattern 112 comprises a plurality of similarly shaped features arranged in an array, as shown in FIG. 2 on the mask 110, for example, because the diffraction orders cancel each other out or are collected, resulting in better resolution of features 118 formed on the workpiece 102.

Figure 3:
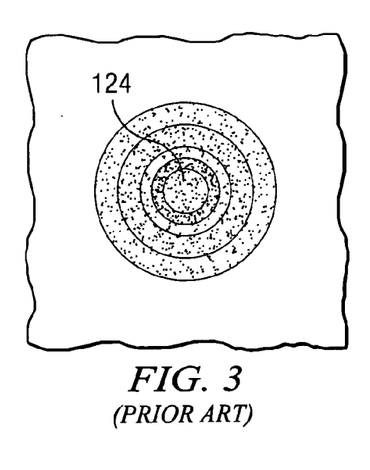
FIG. 3 shows an aerial image of the intensity a layer of resist receives when an isolated feature is patterned using an on-axis illumination method as shown in FIG. 1.
Figure 4:
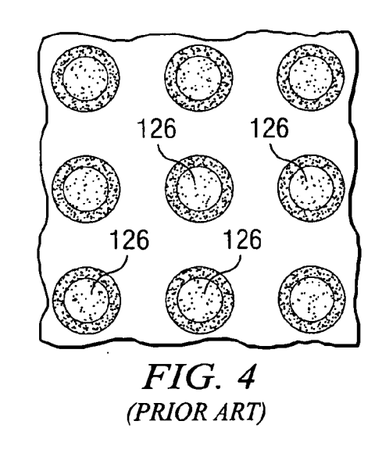
FIG. 4 shows an aerial image of the intensity a layer of resist receives when an array of features is patterned using an on-axis illumination method.

FIG. 3 shows an aerial intensity image of a top view of a semiconductor device and the intensity the device would receive when an isolated feature is patterned using an on-axis illumination method, as shown in FIG. 1. A peak in the intensity is shown at 124, which represents the feature to be patterned. FIG. 4 shows an aerial view of the intensity a layer of resist would receive when an array of features is patterned using an on-axis illumination method. Peaks in the intensity are shown at 126. Using a conventional on-axis illumination technique, the images (e.g., peaks 124 and 126) are typically very weak. For example, simulations of aerial image were performed using a Prolith by KLA-Tencor, a lithography simulation tool, for a 90 nm width isolated contact, and 90 nm contacts on a 140 nm pitch, using a 0.93 numerical aperture (NA) and 0.75 s, wherein "s" represents "sigma," or the partial coherence. The partial coherence is a measure for the width of the light beam in the pupil plane. For an isolated contact, the relative intensity was found to range from about 0.032 to 0.086, and for an array of contacts, the relative intensity was found to range from about 0.032 to 0.092. Thus, conventional on-axis illumination methods have low contrast, and features formed in a resist, e.g., such as the layer of resist 106 of FIG. 1, using this method have low resolution.

Figure 5:
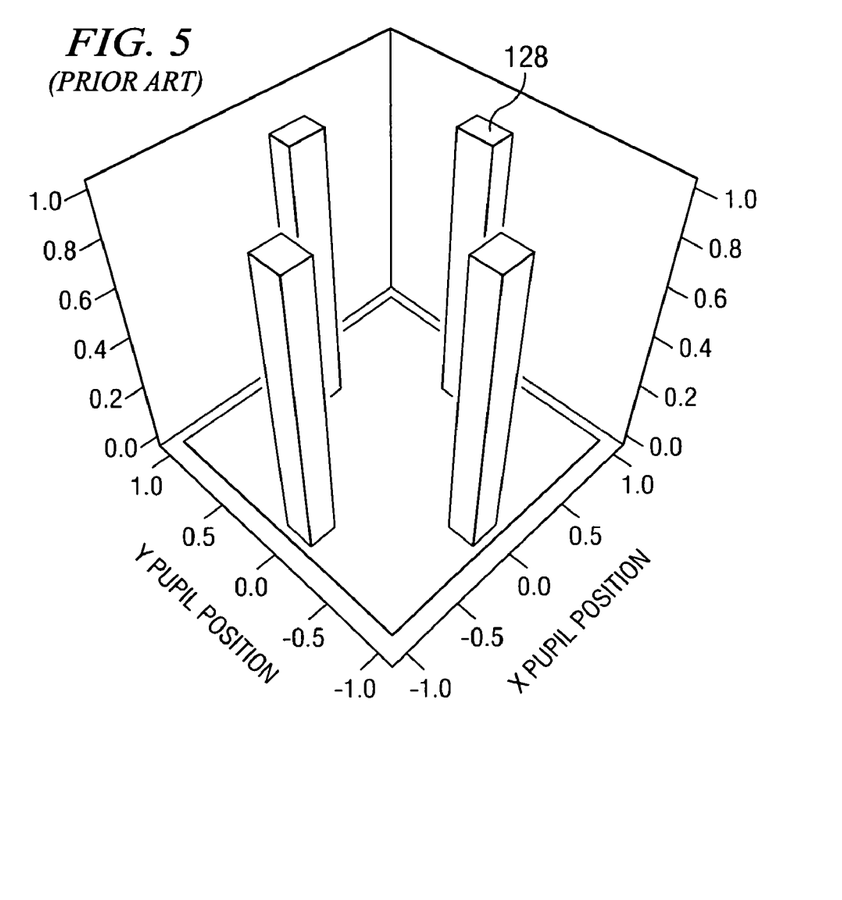
FIG. 5 illustrates the shape of a quadrupole illumination beam, an example of one type of off-axis lithography method.

FIG. 5 illustrates the shape of a quadrupole illumination beam of the prior art, which is one type of off-axis lithography method. A layer of resist, e.g., such as the layer of resist 106 shown in FIG. 2, is illuminated with four beams 128 in this method of lithography, wherein the four beams 128 are located off the axis of the direction of illumination. The beams 128 are shown relative to a Y pupil position and X pupil position in FIG. 5.

Figure 6:
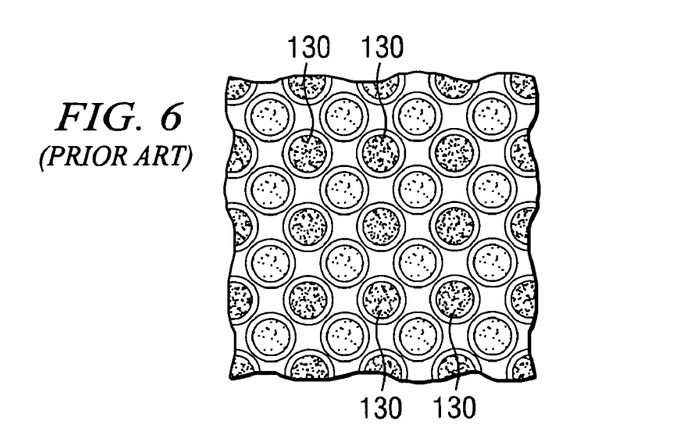
FIG. 6 shows an aerial image of the intensity a layer of resist receives when an array of features are patterned using an off-axis illumination method, as shown in FIGS. 2 and 5.

FIG. 6 shows an aerial image of the intensity a layer of resist receives when an array of features are patterned using an off-axis illumination method, as shown in FIGS. 2 and 5. Peaks in the intensity are shown at 130. Simulations of aerial image were performed using a Prolith simulation tool for 90 nm contacts on a 140 nm pitch, for an RQuad20, a quadrupole illuminator, using a 0.93 NA and 0.89/0.65 s. The relative intensity was found to range from about 0.1146 to 0.0024. Thus, a quadrupole illumination method of an array-like structure has greater contrast than conventional on-axis illumination methods, e.g., such as for isolated structures, as shown in FIG. 3, and for array-like structures, as shown in FIG. 4, and therefore, features formed in a resist using off-axis illumination, e.g., such as the layer of resist 106 of FIG. 2, have higher resolution.

Figure 7:
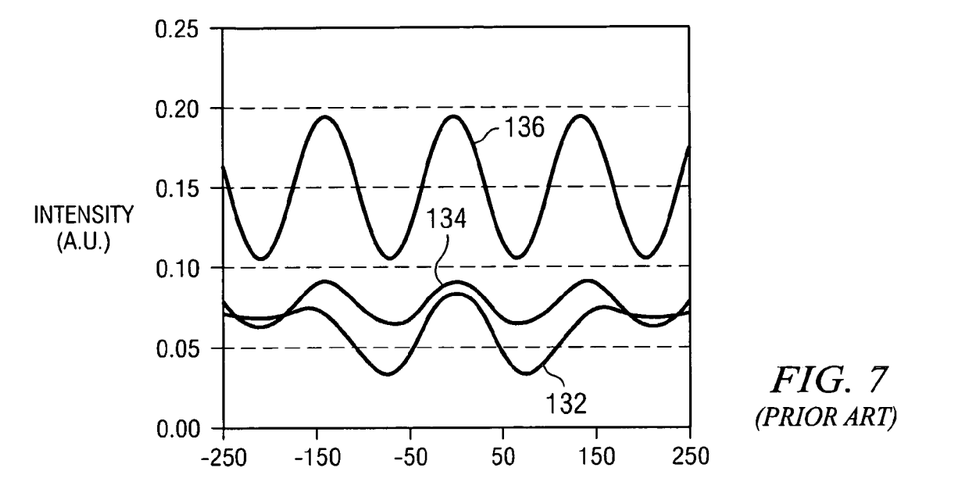
FIG. 7 is a graph comparing the intensity of various types of lithography beams.

FIG. 7 is a graph illustrating an intensity curve comparison of the illumination methods described previously herein. The intensity is a qualitative measure that is shown in arbitrary units (A.U.) for the lithography techniques described herein. The peaks in the graphs represent the image being projected onto the layer of resist 106. The intensity of a single feature is shown at 132 using conventional on-axis lithography techniques, which has little contrast. The intensity of an array of features is shown at 134 using conventional on-axis lithography techniques, wherein increased contrast can be seen compared to the single feature 132. The intensity of an array of features is shown at 136 using an off-axis lithography technique, having a large amount of contrast. Graph 132 illustrates that there is a small process window for conventional illumination due to the weak intensity, for forming isolated contacts, for example.

FIG. 7 illustrates that off-axis lithography techniques have increased intensity, and greater contrast than on-axis lithography techniques. However, off-axis lithography techniques are only beneficial when an array of features is patterned, since more diffraction orders can be collected. For isolated features, there is no contrast improvement with off-axis illumination, due to the fact that diffraction orders of adjacent features cannot be utilized for imaging.

Embodiments of the present invention achieve technical advantages by providing methods of lithography wherein off-axis lithography techniques may be used to pattern isolated features, or smaller groups of isolated features. Two hard masks, two lithography masks and two exposure steps, one using an off-axis lithography technique, and another using a conventional on-axis lithography technique, are used. First, one of the hard masks is patterned with an array of features using the off-axis lithography technique. Then, a portion of the pattern of the array of features is transferred to the other hard mask, using the on-axis lithography technique. Isolated features having improved resolution are formed because the mask used to pattern them is patterned using an off-axis lithography technique. An increased process window is also achieved.

Figure 8:
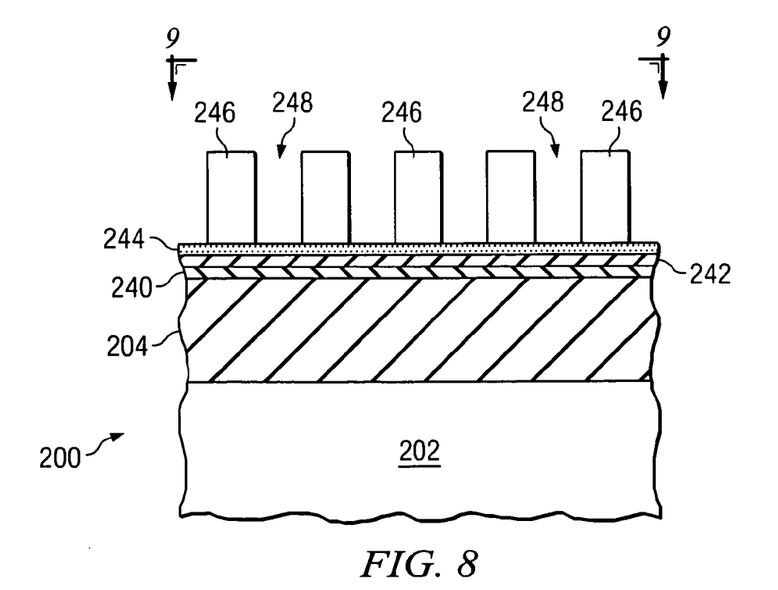
FIGS. 8 through 19 show cross-sectional and top views of a method of patterning a material layer of a semiconductor device in accordance with a preferred embodiment of the present invention at various stages of manufacturing.

FIGS. 8 through 19 show cross-sectional and top views of a method of patterning a material layer of a semiconductor device in accordance with a preferred embodiment of the present invention at various stages of manufacturing. Referring next to FIG. 8, a cross-sectional view of a semiconductor device 200 is shown. The semiconductor device 200 includes a workpiece 202. The workpiece 202 may include a semiconductor substrate comprising silicon or other semiconductor materials covered by an insulating layer, for example. The workpiece 202 may also include other active components or circuits, not shown. The workpiece 202 may comprise silicon oxide over single-crystal silicon, for example. The workpiece 202 may include other conductive layers or other semiconductor elements, e.g., transistors, diodes, etc. Compound semiconductors, GaAs, InP, Si/Ge, or SiC, as examples, may be used in place of silicon. The workpiece 202 may also comprise a silicon-on-insulator (SOI) substrate.

A material layer 204 is disposed over the workpiece 202, as shown. The material layer 204 comprises an insulating layer in one embodiment, although alternatively, the material layer 204 may comprise a conductive material or a semiconductive material, as examples. The material layer 204 may comprise an inter-level dielectric (ILD), and may comprise an oxide, a nitride, a low dielectric constant material, or combinations thereof, as examples, although alternatively, the material layer 204 may comprise other materials. The material layer 204 may comprise a thickness of about 200 nm to about 2 μm, as examples, although alternatively, the material layer 204 may comprise other dimensions. The material layer 204 may comprise a thickness of about 2.5 μm or less, for example. The material layer 204 comprises a layer of material that will be patterned using the novel method of the present invention.

A first hard mask 240 is deposited or formed over the material layer 204. The first hard mask 240 is also referred to herein as a first layer of masking material, for example. In one embodiment, the first hard mask 240 preferably comprises polysilicon. The first hard mask 240 preferably comprises a semiconductive material, an insulator, an oxide, or a nitride, as examples, although alternatively, the first hard mask 240 may comprise other materials, for example. The first hard mask 240 may comprise a thickness of about 20 nm to about 200 nm, as examples, although alternatively, the first hard mask 240 may comprise other dimensions. The first hard mask 240 may comprise about 250 nm or less of material, for example. The first hard mask 240 preferably comprises a material such that the material layer 204 may be etched selective to the first hard mask 240, for example.

A second hard mask 242 is deposited or formed over the first hard mask 240. The second hard mask 242 is also referred to herein as a second layer of masking material, for example. The second hard mask 242 preferably comprises an oxide such as $SiO_2$ in one embodiment. The second hard mask 242 preferably comprises a semiconductive material, an insulator, an oxide, or a nitride, as examples, although alternatively, the second hard mask 242 may comprise other materials, for example. The second hard mask 242 may comprise a thickness of about 20 nm to about 200 nm, as examples, although alternatively, the second hard mask 242 may comprise other dimensions. The second hard mask 242 may comprise about 250 nm or less of material, for example.

The second hard mask 242 preferably comprises a different material than the first hard mask 240. In one embodiment, the first hard mask 240 preferably comprises a material that may be etched selectively to the second hard mask 242 material, for example.

An optional anti-reflective coating (ARC) 244 is preferably deposited over the second hard mask 242 in one embodiment, as shown. An anti-reflective coating is typically used in lithography processes because thin films used in semiconductor manufacturing may be quite reflective; thus, an anti-reflective coating is a thin layer adapted to absorb light that prevents or reduces light from reflecting back towards the light source. The anti-reflective coating 244 may comprise a thickness of about 40 to 100 nm, for example.

A first layer of resist 246 is deposited over the anti-reflective coating 244, or over the second hard mask 242, if an anti-reflective coating 244 is not used. The first layer of resist 246 is also referred to herein as a third layer of masking material. The first layer of resist 246 may comprise a thickness of about 150 nm to about 350 nm, for example, although alternatively, the first layer of resist 246 may comprise other dimensions.

The first layer of resist 246 is patterned with a first pattern 248, preferably using a first lithography step comprising an off-axis lithography illumination technique. The off-axis lithography technique preferably comprises a di-pole, annular, or quadrupole lithography method, as examples, although other off-axis exposure methods may also be used. Because an off-axis lithography technique is used for the first lithography process, the first pattern 248 has a high resolution, and the features of the first pattern 248 may be made very small, e.g., the size of a minimum feature size of the semiconductor device 200, for example.

Figure 9:
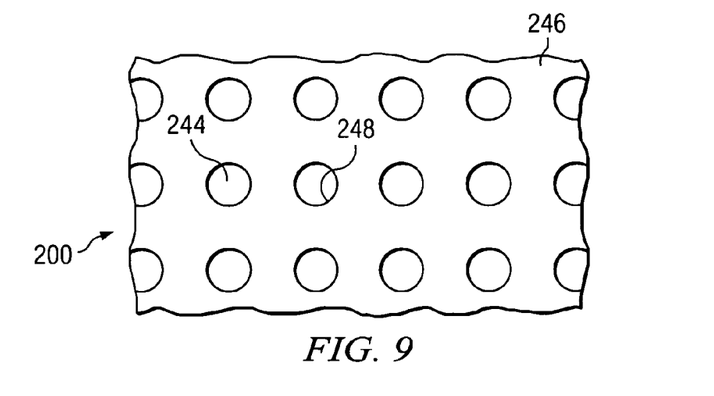

The first pattern 248 comprises a plurality of apertures. The first pattern 248 comprises a pattern for densely populated features, in one embodiment. A top view of the semiconductor device 200 after the first layer of resist 246 has been patterned is shown in FIG. 9. The first pattern 248 is shown as a plurality of circular holes in FIG. 9; however, the first pattern 248 may comprise other shapes, such as squares, rectangles, ovals, triangles, or other geometric shapes, as examples. The first pattern 248 preferably comprises a pattern for an array or grid of features. The features in the array preferably have substantially the same shape in one embodiment, so that diffraction effects are minimized and dense pitches can be resolved.

The first pattern 248 preferably includes dummy features formed where features are not actually desired in the final design. A portion of the first pattern 248, e.g., the dummy features, will not be transferred to the material layer 204, for example. The dummy features are included in the first pattern 248 to enable the use of the off-axis lithography technique, and to minimize diffraction effects that could reduce the resolution of the first pattern 248, for example.

Figure 10:
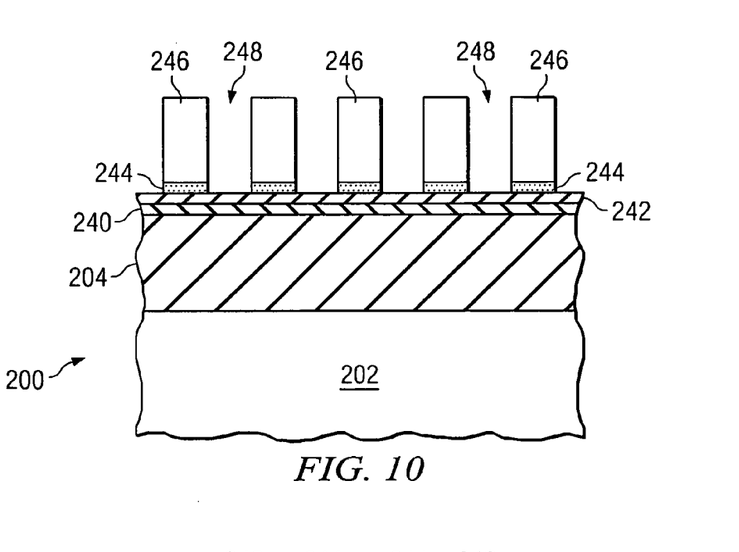
Figure 11:
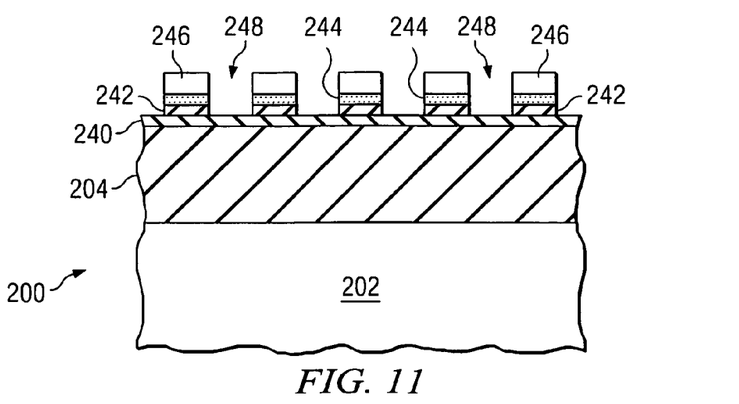
Figure 12:
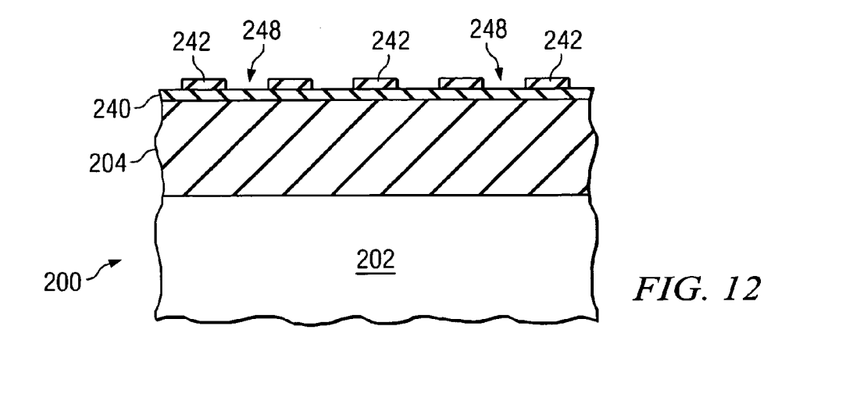

The first layer of resist 246 is used as a mask while exposed portions of the anti-reflective coating 244 are etched away, as shown in FIG. 10. The first layer of resist 246 is then used as a mask while exposed portions of the second hard mask 242 are etched away, as shown in FIG. 11, transferring the first pattern 248 to the second hard mask 242. The second hard mask 242 may be etched using a reactive ion etch (RIE) process, for example, although alternatively, other etch processes may be used. The first layer of resist 246 and the anti-reflective coating 244 are then removed, as shown in FIG. 12.

Next, a second layer of resist 250 (FIG. 13) is deposited over the patterned second hard mask 242 and exposed portions of the first hard mask 240. The second layer of resist 250 may comprise a thickness of about 150 nm to about 350 nm, for example, although alternatively, the second layer of resist 250 may comprise other dimensions.

Figure 13:
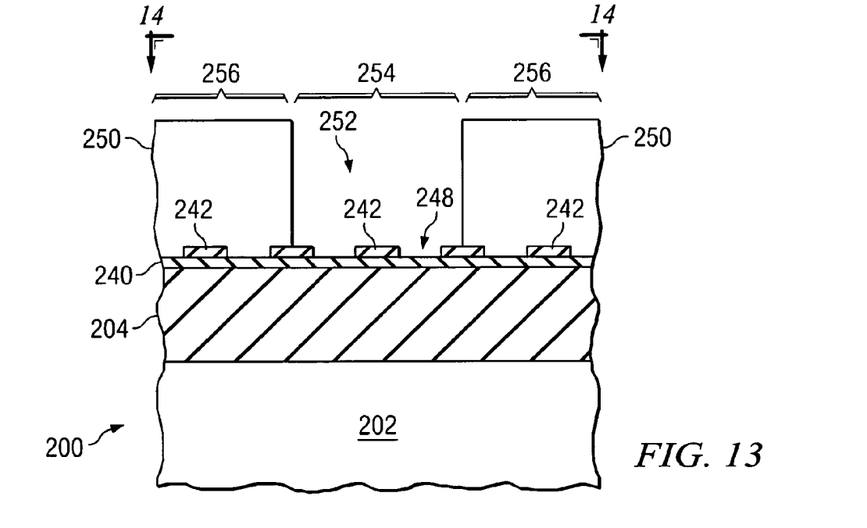
Figure 14:
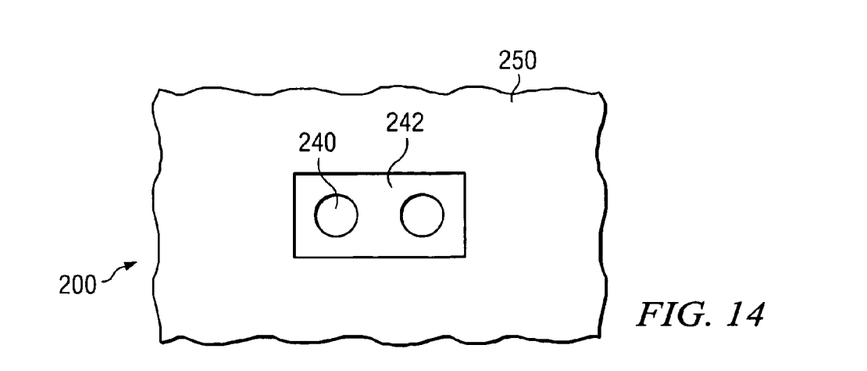

The second layer of resist 250 is patterned with a second pattern 252 using a second lithography step, as shown in FIG. 13. Preferably, the lithography method used to pattern the second layer of resist 250 with the second pattern 252 comprises a conventional on-axis and/or projection lithography method that may have relaxed ground rules, for example. The second layer of resist 250 and the second lithography step is used as a trim lithography step, for example, and thus, the second layer of resist 250 is opened to expose the apertures of the first pattern 248 that will be used to pattern the material layer 204. The second layer of resist 250 is patterned with the second pattern 252 to expose a portion of the first pattern 248 in the second hard mask 242, as shown in FIG. 13 in a cross-sectional view and in a top view in FIG. 14.

The second pattern 252 is preferably different than the first pattern 248, for example. The second pattern 252 is preferably larger than the first pattern 248 of the second hard mask 242, in one embodiment. In another embodiment, for example, the second pattern 252 comprises a plurality of apertures in the second layer of resist 250, wherein the apertures of the second pattern 252 are larger than the apertures of the first pattern 248. If the first pattern 248 comprises densely populated features, then the second pattern 252 preferably comprises one or more of the densely populated features, in one embodiment.

The second pattern 252 creates nested features or isolated features comprised of the first pattern 248, depending on the size and shape of the openings in the second pattern 252. The second layer of resist 250 is preferably exposed in the second lithography step using a different illuminator than the illuminator used to expose the first layer of resist 246 in the first lithography step, in one embodiment.

In one embodiment, at least a portion of the second pattern 252 preferably is at least as large as one aperture in the second hard mask 242. As another example, at least a portion of the second pattern 252 is preferably at least as large as two or more apertures in the second hard mask 242, as shown in FIG. 13.

Regions 254 of the workpiece 202 comprise regions where isolated features or groups of features will be formed in material layer 204. Regions 256 of the workpiece 202 comprise regions where isolated features or groups of features will not be formed in the material layer 204; thus, regions 256 comprise areas where the first patterns 248 in the second hard mask 242 comprise dummy patterns.

Figure 15:
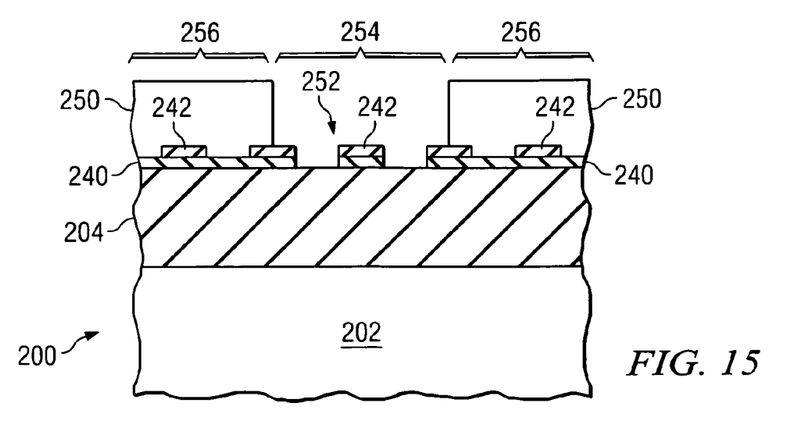

The second layer of resist 250 and the second hard mask 242 are then used as a mask to pattern the first hard mask 240, as shown in FIG. 15. The first hard mask 240 may be etched using a RIE process, for example, although alternatively, other etch processes may be used. The second layer of photoresist 250 and optionally, the second hard mask 242 are then removed, as shown in FIG. 16.

Figure 16:
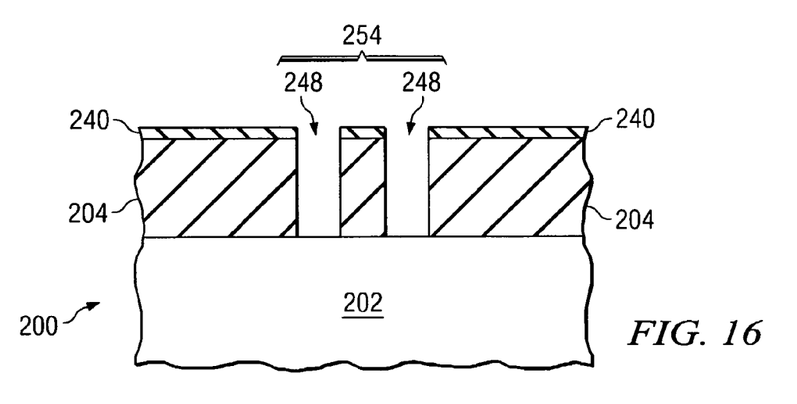

The first hard mask 240 is then used as a mask while exposed portions of the material layer 204 are etched away, also shown in FIG. 16. The material layer 204 may be etched using a RIE process, for example, although alternatively, other etch processes may be used to pattern the material layer 204.

Figure 17:
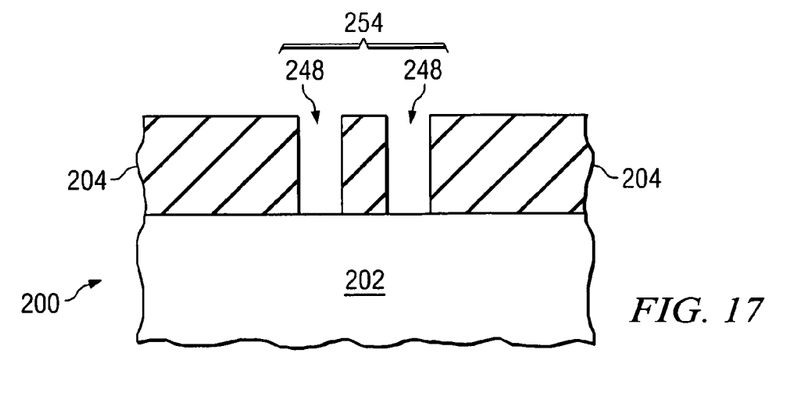

The first hard mask 240 may then be removed, as shown in FIG. 17, or alternatively, the first hard mask 240 may be left remaining in the structure, for example (not shown). Thus, the first pattern 248 has been transferred to the material layer 204 only in region 254, as shown, of the workpiece 204 (e.g., and the first pattern 248 is not transferred to the material layer 204 in region 256; see FIG. 15).

In one embodiment, the second hard mask 242 may be left remaining over the first hard mask 240 when the material layer 204 is patterned, for example (not shown in the Figures). In this embodiment, all or a portion of the second hard mask 242 may be removed during the patterning of the material layer 204, for example.

Figure 18:
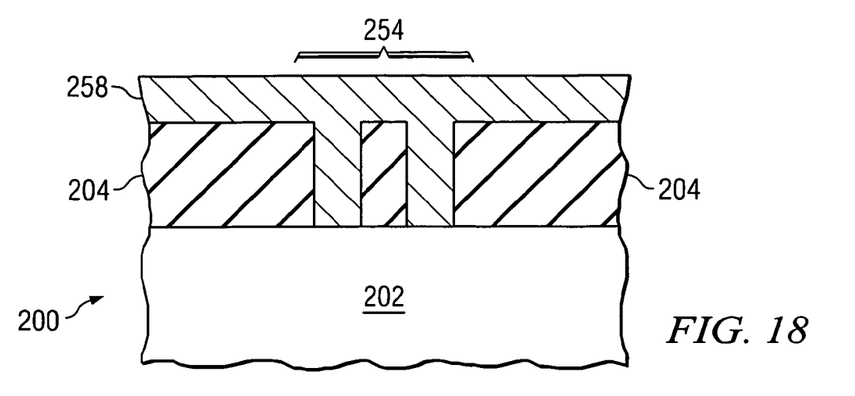

If the material layer 204 comprises an insulating material, the first hard mask 240 is used to pattern the material layer 204 in a damascene process, for example. A conductive material 258 may then be deposited over the patterned material layer 204, as shown in FIG. 18. The conductive material 258 preferably comprises tungsten (W) or a tungsten alloy, for example, if the features formed in the material layer 204 comprise contacts, for example. The conductive material 258 may comprise copper, aluminum, tungsten, other metals, or alloys thereof, or semiconductive materials and combinations thereof with metals as examples, although alternatively, the conductive material 258 may comprise other materials. The conductive material 258 may include a liner (not shown) comprised of Ta, TaN, or TiN, and may include a seed layer formed over the material layer 204 prior to filling the patterns with a conductive material 258, for example. The conductive material 258 may be formed by physical vapor deposition (PVD) or by plating, as examples, although the conductive material 258 may be deposited using other methods.

Figure 19:
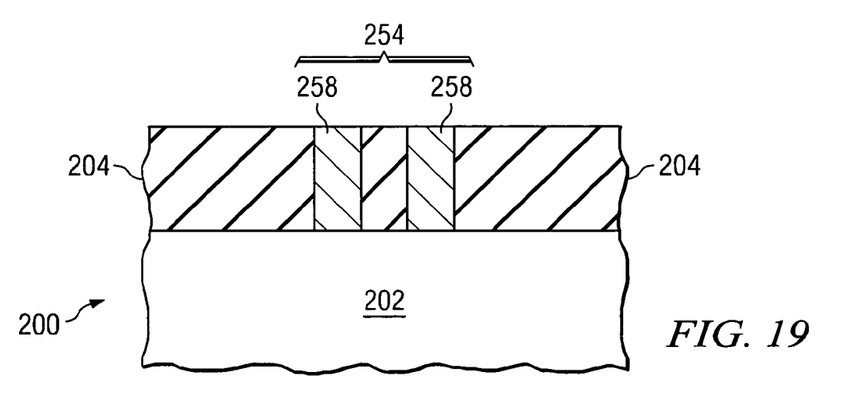

Excess conductive material 258 may then be removed from over the top surface of the material layer 204, e.g., using an etch process and/or a chemical-mechanical polish (CMP) process, as shown in FIG. 19. The conductive material 258 left remaining within the patterned material layer 204 may comprise contacts, for example, although alternatively, the conductive material 258 may also comprise resistor islands, conductive lines (e.g., smaller conductive lines that couple together two adjacent devices), or other elements comprising a minimum feature size of the semiconductor device or greater, as examples.

Figure 20:
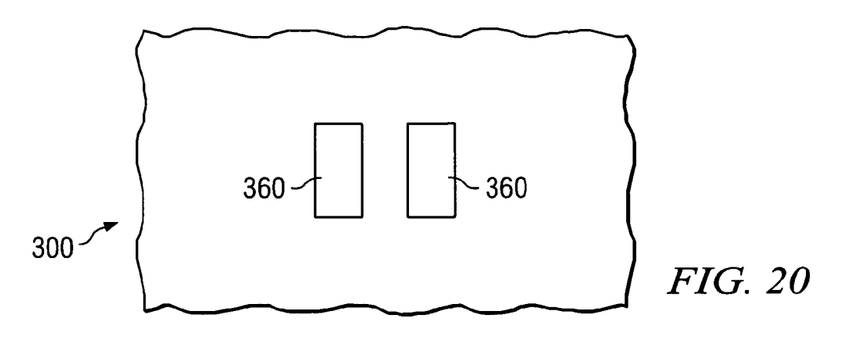
FIG. 20 shows a top view of a semiconductor device patterned in accordance with another embodiment of the present invention.

FIG. 20 shows a top view of a semiconductor device patterned in accordance with another embodiment of the present invention, wherein the features formed in a material layer of a semiconductor device 300 comprise resistor islands or short conductive lines 360, for example.

Advantages of embodiments of the invention include providing a novel method of patterning features of a semiconductor device 200/300. The method is an effective way of creating ultra-dense, isolated, paired, and semi-isolated contacts, in one embodiment. The novel patterning method described herein advantageously allows for very small, isolated features (e.g., the first pattern 248) to be patterned using advanced lithography techniques such as off-axis illumination. Because the first pattern 248 comprises an array or grid of substantially similarly shaped features, diffraction effects can be utilized more effectively, and the resolution of the first pattern 248 is increased. The second layer of resist 250 is used to block a portion of the patterned second hard mask 242 so that the dummy patterns in the second hard mask 242 will not be transferred to the material layer 204. Also, advantageously, because the second pattern 252 is larger than the first pattern 248 (see FIG. 13), the second layer of resist 250 may be patterned using a conventional on-axis lithography technique, in one embodiment. More relaxed ground rules may be used for the patterning of the second layer of resist 250, for example, and there is increased margin for error or an increased process window in the second lithography process.

The novel method described herein provides a means of structuring dense contact holes in one embodiment. Strong off-axis illumination is used to image the array-like arrangement of contact holes, e.g., onto the second hard mask 242, at a very dense pitch and very small target dimensions. Using a double hard mask, e.g., first hard mask 240 and second hard mask 242, and a trim exposure (e.g., the second exposure of the second layer of resist 250), unwanted features of the array pattern (e.g., the first pattern 248) are omitted, and thus, a random logic contact layer with isolated, semi-isolated and nested contacts can be formed in a material layer 204, as shown in FIG. 19. Optical proximity correction (OPC) or other means of attempting to reduce diffraction effects can be eliminated for random logic contacts, for example.

Embodiments of the invention provide a dual exposure lithography scheme combined with a dual hard mask for printing dense and isolated features, with a significantly improved process window. The two exposure steps are preferably performed using two different illuminators.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of patterning a material layer of a semiconductor device, the method comprising:

providing a workpiece, a material layer being disposed over the workpiece;

depositing a first layer of masking material over the material layer;

forming a second layer of masking material over the first layer of masking material, the first layer of masking material being unpatterned and the second layer of masking material defining a first pattern comprising densely populated features over a selected area;

forming another layer of masking material over at least a portion of the selected area of the second layer of masking material patterned with said densely populated features according to said first pattern;

patterning the another layer of masking material according to a second pattern, said second pattern being different than said first pattern, and at least a portion of the second pattern being larger than and at least partially surrounding at least one of said densely populated features of the first pattern found in the second layer of masking material;

using the another layer of masking material patterned according to said second pattern and the second layer of masking material patterned according to said first pattern as a combination mask to pattern the first layer of masking material; and using at least the first layer of masking material as a mask to pattern the material layer.

2. The method according to claim 1, wherein the first pattern comprises a pattern for features comprising a minimum feature size of the semiconductor device, contact holes, resistor islands, or conductive lines.

3. The method according to claim 1, wherein forming the second layer of masking material comprises:

depositing the second layer of masking material; and patterning the second layer of masking material with the first pattern.

4. The method according to claim 3, further comprising:

depositing an anti-reflective coating over the second layer of masking material, before patterning the second layer of masking material;

depositing a layer of resist over the anti-reflective coating;

patterning the layer of resist with the first pattern;

using the layer of resist as a mask to pattern the anti-reflective coating and the second layer of masking material; and removing the layer of resist and the anti-reflective coating.

5. The method according to claim 4, wherein pattering the second layer of masking material with the first pattern comprises using an off-axis lithography method.

6. The method according to claim 5, wherein the off-axis lithography method comprises a di-pole, annular, or quadrupole lithography method.

7. The method according to claim 5, wherein forming said another layer of masking material comprises depositing the another layer of masking material, and patterning the another layer of masking material with the second pattern using an on-axis lithography method.

8. The method according to claim 7, wherein forming the another layer of masking material comprises forming a layer of resist.

9. The method according to claim 1, wherein forming the another layer of masking material comprises depositing the another layer of masking material, and patterning the another layer of masking material with the second pattern.

10. The method according to claim 9, wherein patterning the another layer of masking material comprises using an on-axis lithography method.

11. The method according to claim 9, wherein forming the another layer of masking material comprises forming a layer of resist.

12. The method according to claim 1, wherein patterning the material layer comprises forming isolated features or groups of features.

13. The method according to claim 1, wherein the material layer disposed over the workpiece comprises an insulating layer, further comprising filling the patterned material layer with a conductive material.

14. The method according to claim 1, wherein depositing the first layer of masking material comprises depositing a first hard mask, wherein forming the second layer of masking material comprises forming a second hard mask, the first hard mask comprising a material that is etchable selective to the second hard mask.

15. The method according to claim 1, wherein depositing the first layer of masking material comprises depositing a semiconductive material, an insulator, an oxide, or a nitride, wherein depositing the second layer of masking material comprises depositing a semiconductive material, an insulator, an oxide, or a nitride, and wherein the second layer of masking material comprises a different material than the first layer of masking material.

16. The method according to claim 15, wherein depositing the first layer of masking material comprises depositing about 250 nm or less of material, and wherein depositing the second layer of masking material comprises depositing about 250 nm or less of material.

17. A method of patterning a material layer of a semiconductor device, the method comprising:
   providing a workpiece;
   forming a material layer over the workpiece;
   depositing a first hard masking material over the material layer;
   depositing a second hard masking material over the first hard masking material, wherein the first hard masking material is unetched and comprises a material that is etchable selective to the second hard masking material:
   depositing an anti-reflective coating over the second hard masking material;
   depositing a first layer of resist over the anti-reflective coating;
   patterning the first layer of resist with a first pattern comprising densely populated features using an off axis lithography method;
   using the patterned first layer of resist as a mask to remove exposed portions of the anti-reflective coating and portions of the second hard masking material to form a second hard mask in a selected area according to said first pattern that comprises densely populated features, and to leave portions of the unetched first hard masking material in said selected area exposed;
   removing the first layer of resist and the anti-reflective coating;
   depositing a second layer of resist over the patterned second hard mask and exposed unetched portions of the first hard masking material;
   patterning the second layer of resist with a second pattern using an on-axis lithography method, the second pattern being different and larger than said first pattern and at least partially surrounding at least one of said densely populated features on the first pattern;
   using the patterned second layer of resist and the patterned second hard mask in combination as a mask to remove said exposed portions of the first hard masking material to form a first hard mask;
   removing at least the second layer of resist; and
   using the first hard masking material as a mask to remove portions of the material layer, patterning the material layer.

18. The method according to claim 17, wherein the material layer comprises an insulating material further comprising filling the insulating material with a conductive material, wherein the first pattern comprises a pattern for an array of conductive features.

19. The method according to claim 17, wherein depositing the first hard masking material comprises depositing a semiconductive material, an insulator, an oxide, or a nitride, and wherein depositing the second hard masking material comprises depositing a semiconductive material, an insulator, an oxide, or a nitride.

20. The method according to claim 17, wherein the off-axis lithography method comprises a di-pole, annular, or quadrupole lithography method.

* * * * *